US011670909B2

(12) United States Patent
Meister et al.

(10) Patent No.: US 11,670,909 B2
(45) Date of Patent: Jun. 6, 2023

(54) PHOTONIC COMPONENT

(71) Applicant: Sicoya GmbH, Berlin (DE)

(72) Inventors: Stefan Meister, Berlin (DE); Hanjo Rhee, Berlin (DE)

(73) Assignee: SICOYA GMBH, Berlin (DE)

( * ) Notice: Subject to any disclaimer, the term of this patent is extended or adjusted under 35 U.S.C. 154(b) by 1125 days.

(21) Appl. No.: 16/331,956

(22) PCT Filed: Sep. 1, 2017

(86) PCT No.: PCT/DE2017/200088
§ 371 (c)(1),
(2) Date: Mar. 8, 2019

(87) PCT Pub. No.: WO2018/050180
PCT Pub. Date: Mar. 22, 2018

(65) Prior Publication Data
US 2019/0207368 A1 Jul. 4, 2019

(30) Foreign Application Priority Data

Sep. 16, 2016 (DE) ............ 10 2016 217 749.4

(51) Int. Cl.
H04B 10/00 (2013.01)
H01S 5/14 (2006.01)
(Continued)

(52) U.S. Cl.
CPC .......... H01S 5/143 (2013.01); G02B 6/12002 (2013.01); G02B 6/12004 (2013.01);
(Continued)

(58) Field of Classification Search
CPC ....... H01S 5/143; G02B 6/4214; G02B 6/124; G02B 6/4206; G02B 6/136
See application file for complete search history.

(56) References Cited

U.S. PATENT DOCUMENTS 5,282,080 A 1/1994 Scifres et al.
6,274,891 B1 8/2001 Tanaka et al.
(Continued)

FOREIGN PATENT DOCUMENTS

DE 10 2014 219 663 A1 3/2016
WO WO-2015062641 A1 * 5/2015 ........... G02B 5/1814
WO WO 2016/011002 A1 1/2016

OTHER PUBLICATIONS

International Search Report and Written Opinion dated Jan. 17, 2018 issued in related International Application No. PCT/DE2017/200088; filed Sep. 1, 2017.
(Continued)

Primary Examiner — Pranesh K Barua
(74) Attorney, Agent, or Firm — Gordon Rees Scully Mansukhani, LLP

(57) ABSTRACT

The invention relates to a photonic component (1) having at least one semiconductor laser amplifier (200), which has at least one first mirror surface (210a) for coupling and/or decoupling optical radiation (S). The first mirror surface (210a) of the semiconductor laser amplifier (200) is coupled to a photonically integrated chip (100), wherein the chip (100) is arranged such that the chip can emit optical radiation (S) from the chip top side (O100) thereof in the direction of the first mirror surface (210a) and couple said radiation in the semiconductor laser amplifier (200), and wherein the emitting of the radiation (S) away from the chip (Continued)

Figure 1:
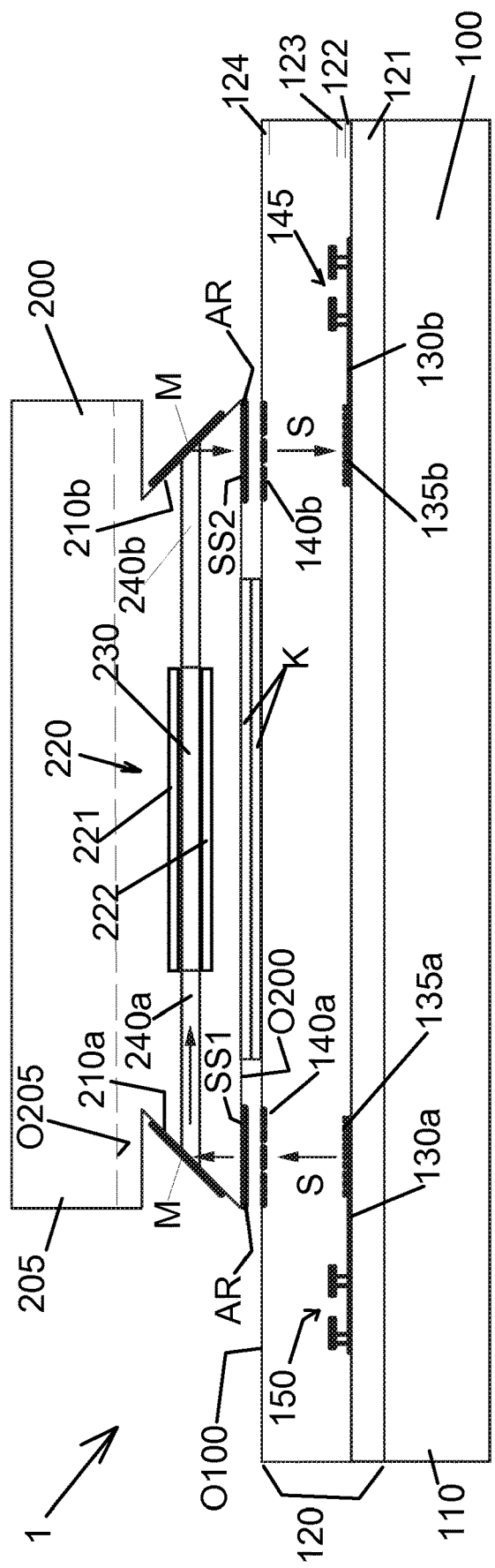

top side (O100) occurs in the direction of the first mirror surface (210a) at an angle of 90°±20°, in particular perpendicular, to the chip top side (O100).

19 Claims, 12 Drawing Sheets

(51) Int. Cl.
*G02B 6/42* (2006.01)
*H01S 5/02* (2006.01)
*G02B 6/34* (2006.01)
*G02B 6/12* (2006.01)
*G02B 6/43* (2006.01)
*H01S 5/10* (2021.01)
*H01L 27/00* (2006.01)
*H01S 5/02251* (2021.01)
*H01S 5/40* (2006.01)
*H01S 5/026* (2006.01)

(52) U.S. Cl.
CPC ............. *G02B 6/34* (2013.01); *G02B 6/4214* (2013.01); *G02B 6/43* (2013.01); *H01L 27/00* (2013.01); *H01S 5/021* (2013.01); *H01S 5/02251* (2021.01); *H01S 5/1085* (2013.01); *H01S 5/141* (2013.01); *H01S 5/026* (2013.01); *H01S 5/14* (2013.01); *H01S 5/4025* (2013.01)

(56) References Cited

U.S. PATENT DOCUMENTS

| | | | |
|---|---|---|---|
| 6,845,184 B1 | 1/2005 | Yoshimura et al. | |
| 9,742,150 B1* | 8/2017 | Hofrichter | .......... H01S 5/04256 |
| 2006/0067608 A1 | 3/2006 | Kobayashi et al. | |
| 2008/0050081 A1* | 2/2008 | Goebel | .................. G02B 27/62 |
| | | | 385/131 |
| 2011/0052114 A1 | 3/2011 | Bernasconi et al. | |
| 2011/0091157 A1* | 4/2011 | Yao | ........................... G02B 6/13 |
| | | | 385/39 |
| 2013/0141800 A1* | 6/2013 | Oi | ............................ G02B 3/08 |
| | | | 359/743 |
| 2013/0156366 A1 | 6/2013 | Raj et al. | |
| 2013/0235450 A1* | 9/2013 | Pitwon | ................. H05K 1/0274 |
| | | | 359/341.3 |
| 2014/0268312 A1 | 9/2014 | Zheng et al. | |
| 2017/0207600 A1* | 7/2017 | Klamkin | ................. H01S 5/141 |
| 2017/0242191 A1 | 8/2017 | Rhee et al. | |

OTHER PUBLICATIONS

German Examination Report dated Apr. 26, 2017 issued in related German Patent Application No. 10 2016 217 749.4; filed Sep. 16, 2016.

* cited by examiner

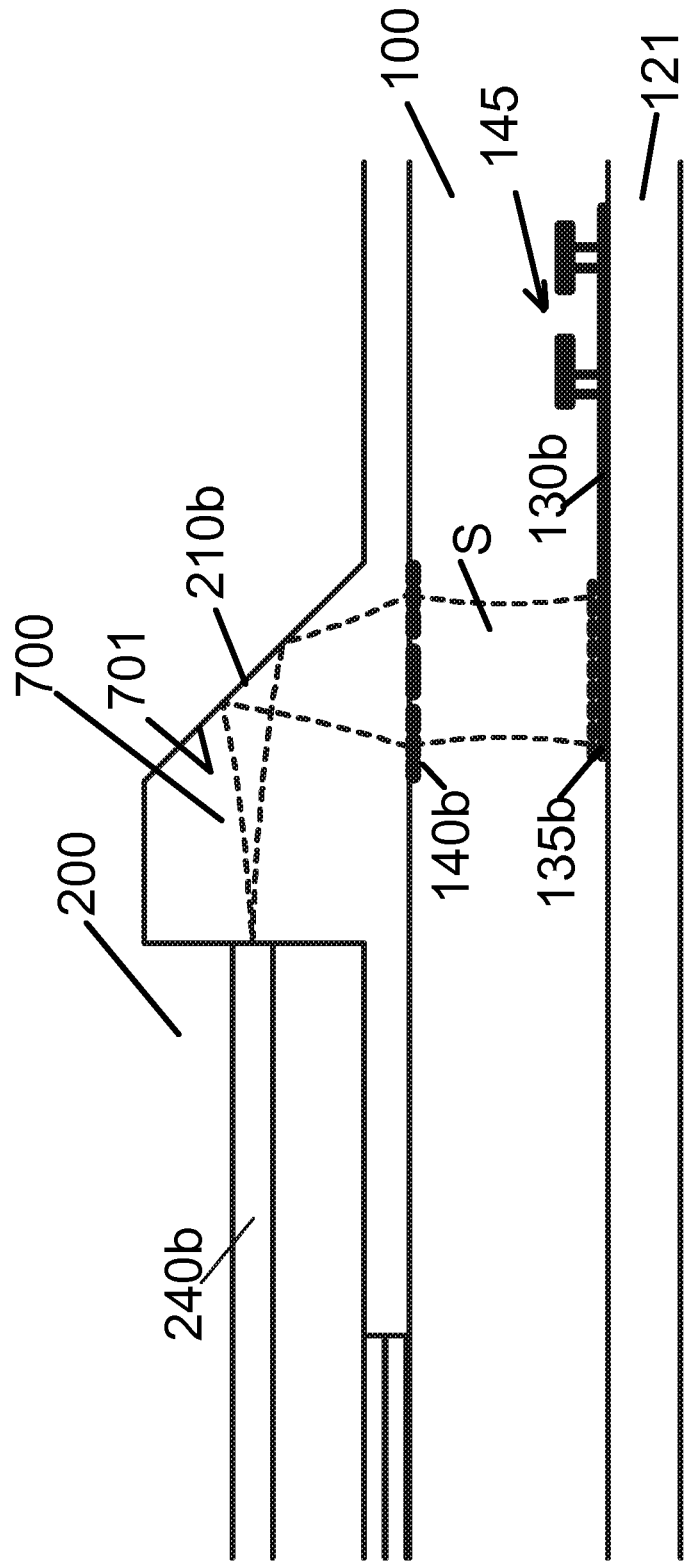

PHOTONIC COMPONENT

The invention relates to a photonic component having at least one semiconductor laser amplifier comprising at least one first mirror surface for coupling in and/or coupling out optical radiation.

Such a photonic component is known for example from the US patent specification U.S. Pat. No. 5,282,080 A.

The invention is based on the object of specifying a photonic component which comprises an additional chip and which has a particularly compact construction, but can nevertheless be fabricated very simply and cost-effectively.

This object is achieved according to the invention by means of a photonic component having the features as claimed in patent claim 1. Advantageous configurations of the component according to the invention are specified in dependent claims.

Accordingly, the invention provides that the first mirror surface of the semiconductor laser amplifier is coupled to the photonic integrated chip, wherein the chip is arranged in such a way that it can emit optical radiation from its chip top side in the direction of the first mirror surface and couple it into the semiconductor laser amplifier and/or can receive at its chip top side radiation amplified by the semiconductor laser amplifier and coming from the first mirror surface and couple it into itself, and wherein the radiation is emitted away from the chip top side in the direction of the first mirror surface at an angle of 90°±20°, in particular perpendicular, to the chip top side and/or the radiation coming from the first mirror surface is coupled into the chip at an angle of 90°±20°, in particular perpendicular, to the chip top side.

One major advantage of the component according to the invention can be seen in the fact that this component enables a vertical construction because the radiation can be transported between chip and semiconductor laser amplifier perpendicular or at least almost perpendicular to the chip top side and perpendicular or at least almost perpendicular to the top side and/or underside of the semiconductor laser amplifier. The mirror surfaces allow a propagation of optical radiation in the semiconductor laser amplifier and in the chip in a plane parallel or at least almost parallel to the chip top side and parallel or at least almost parallel to the top side and/or underside of the semiconductor laser amplifier.

With regard to a particularly compact construction of the component it is considered to be advantageous if the chip comprises a substrate, at least one integrated optical waveguide which is integrated in one or more waveguiding material layers of the chip situated on the substrate, at least one coupler, in particular grating coupler, which is formed in the optical waveguide or is connected to the optical waveguide, and at least one optical diffraction and refraction structure which is arranged in the region of the chip top side and which is integrated in one or more material layers of the chip situated—as viewed from the substrate—above the optical coupler and carries out a beam shaping of the radiation before coupling into the waveguide or after coupling out of the waveguide.

One advantage of the last-mentioned embodiment variant can be seen in the fact that as a result of the integration of waveguide, coupler and diffraction and refraction structure into the chip, on the one hand, and the arrangement of the diffraction and refraction structure in the beam path between coupler and mirror surface, on the other hand, optimum coupling conditions can be provided in a very simple manner.

A further advantage of the last-mentioned embodiment variant consists in the fact that the latter is producible in a highly reproducible manner since the component parts relevant to a coupling, namely the diffraction and refraction structure and the grating coupler, can already be fabricated in the context of chip production.

The substrate basic material of the substrate can be for example a material such as silicon, germanium, InP, GaAs, etc.

It is advantageous, in particular, if the chip is connected to the semiconductor laser amplifier in such a way, in particular bears by its top side on the top side or underside of the semiconductor laser amplifier in such a way, that the optical diffraction and refraction structure lies in the beam path between the coupler and the first mirror surface of the semiconductor laser amplifier.

An active amplifier section of the semiconductor laser amplifier is preferably situated in at least one active material layer arranged on a top side of a substrate of the semiconductor laser amplifier.

The active material layer is preferably arranged parallel to the material layer(s) of the chip in which the at least one integrated optical waveguide of the chip is integrated.

The semiconductor laser amplifier preferably comprises at least one second mirror surface in addition to the first mirror surface.

If two mirror surfaces are present, then a first preferred embodiment variant can provide for the chip to comprise: a first integrated optical waveguide, a first coupler which is formed in the first optical waveguide or is connected to the first optical waveguide, a first optical diffraction and refraction structure which is arranged in the region of the chip top side and which is integrated in one or more material layers of the chip situated—as viewed from the substrate—above the first optical coupler and is radiation-connected to the first mirror surface of the semiconductor laser amplifier and carries out a beam shaping of the radiation after coupling out of the first waveguide and before emission at the chip top side, a second integrated optical waveguide, a second coupler which is formed in the second optical waveguide or is connected to the second optical waveguide, and a second optical diffraction and refraction structure which is arranged in the region of the chip top side and which is integrated in one or more material layers of the chip situated—as viewed from the substrate—above the first and second optical couplers and is radiation-connected to the second mirror surface of the semiconductor laser amplifier and carries out a beam shaping of the radiation amplified by the semiconductor laser amplifier before coupling into the second coupler of the chip.

In the case of the first preferred embodiment variant, it is advantageous if an active amplifier section of the semiconductor laser amplifier is situated in at least one active material layer arranged on a top side of a substrate of the semiconductor laser amplifier, and the active material layer is arranged parallel to the material layer(s) of the chip in which the first and second integrated optical waveguides of the chip are integrated.

If the semiconductor laser amplifier comprises two mirror surfaces, then a second preferred embodiment variant can also provide that one of the mirror surfaces, that is to say the first or the second mirror surface, forms an optical mirror connection between an optical beam interface of the semiconductor laser amplifier, said optical beam interface being arranged at the top side of the semiconductor laser amplifier, and an active amplifier section of the semiconductor laser amplifier, and the other mirror surface forms a mirror connection between an optical beam interface of the semiconductor laser amplifier, said optical beam interface being arranged at the underside of the semiconductor laser amplifier, and the active amplifier section of the semiconductor laser amplifier.

In the case of the second preferred embodiment variant, it is advantageous if the first mirror surface of the semiconductor laser amplifier is coupled to the chip and the second mirror surface is coupled to an optical fiber, the fiber longitudinal direction of which is arranged at an angle of 90°±10°, in particular perpendicular, to the top side and/or underside of the semiconductor laser amplifier. Alternatively, it can advantageously be provided that the component comprises at least one first and one second photonic integrated chip which enclose the semiconductor laser amplifier between them, in particular to form a sandwich structure, the first mirror surface of the semiconductor laser amplifier is coupled to the first chip and a second mirror surface of the semiconductor laser amplifier is coupled to the second chip.

In the case of the last-mentioned embodiment variant with a sandwich structure, it is particularly advantageous if the first mirror surface forms an optical mirror connection between an optical beam interface arranged at the top side of the semiconductor laser amplifier and an active amplifier section of the semiconductor laser amplifier, and the second mirror surface forms a mirror connection between an optical beam interface arranged at the underside of the semiconductor laser amplifier and the active amplifier section of the semiconductor laser amplifier.

In the case of the embodiment variant with a sandwich structure, it is additionally advantageous if an active amplifier section of the semiconductor laser amplifier is situated in at least one active material layer arranged on a top side of a substrate of the semiconductor laser amplifier, and the active material layer is arranged parallel to the material layer(s) of the first chip in which at least one integrated optical waveguide of the first chip is integrated, and is arranged parallel to the material layer(s) of the second chip in which at least one integrated optical waveguide of the second chip is integrated.

In the case of the embodiment variant with a sandwich structure, the first chip preferably comprises a first integrated optical waveguide, a first coupler which is formed in the first optical waveguide or is connected to the first optical waveguide, a first optical diffraction and refraction structure which is arranged in the region of the chip top side and which is integrated in one or more material layers of the chip situated—as viewed from the substrate of the first chip—above the first optical coupler and is radiation-connected to the first mirror surface of the semiconductor laser amplifier and carries out a beam shaping of the radiation after coupling out of the first waveguide and before emission at the chip top side.

In the case of the embodiment variant with a sandwich structure, the second chip preferably comprises a second integrated optical waveguide, a second coupler which is formed in the second optical waveguide or is connected to the second optical waveguide, a second optical diffraction and refraction structure which is arranged in the region of the chip top side and which is integrated in one or more material layers of the chip situated—as viewed from the substrate of the second chip—above the second optical coupler and is radiation-connected to the second mirror surface of the semiconductor laser amplifier and carries out a beam shaping of the radiation amplified by the semiconductor laser amplifier before coupling into the second coupler.

In the case of the embodiment variant with a sandwich structure and that with a fiber, it is advantageous if the first and second diffraction and refraction structures are different, in order that the different optical path lengths in the semiconductor laser amplifier can be taken into account.

With regard to the configuration of the semiconductor laser amplifier, it is considered to be advantageous if a layer section of at least one active material layer arranged on a top side of a substrate of the semiconductor laser amplifier forms an amplifier section of the semiconductor laser amplifier that amplifies radiation during the operation of the semiconductor laser amplifier, a first strip waveguide optically connects the first mirror surface and the amplifier section, and a second strip waveguide optically connects the second mirror surface and the amplifier section.

The first and second strip waveguides are preferably formed by strips in the at least one active material layer of the semiconductor laser amplifier.

The width of the first strip waveguide can widen or decrease for the purpose of beam diameter adaptation in the region upstream of the first mirror surface and in the direction of the first mirror surface.

Moreover, the width of the second strip waveguide can widen or decrease for the purpose of beam diameter adaptation in the region upstream of the second mirror surface and in the direction of the second mirror surface.

It is furthermore advantageous with regard to the configuration of the semiconductor laser amplifier if the first mirror surface is at an angle of between 30° and 60° to the direction of propagation of the radiation in the active material layer of the semiconductor laser amplifier, and/or a second mirror surface is arranged parallel to the first mirror surface or is arranged in a manner mirrored with respect to the latter, specifically in a manner mirrored about the surface normal to the active material layer.

Preferably, two or more semiconductor laser amplifiers are coupled to the photonic integrated chip, in particular both chips in the case of a sandwich structure.

In the case of a plurality of semiconductor laser amplifiers, it is advantageous if two or more semiconductor laser amplifiers lie in the same plane and are arranged linearly one behind another, in particular one behind another along the longitudinal direction of the strip waveguides of the semiconductor laser amplifiers that are formed in the active material layer, and/or two or more semiconductor laser amplifiers lie in the same plane and are arranged linearly one behind another, in particular one behind another in an arrangement direction perpendicular to the longitudinal direction of the strip waveguides of the semiconductor laser amplifiers that are formed in the active material layer, and/or two or more semiconductor laser amplifiers lie in the same plane, specifically in a two-dimensional arrangement, wherein the plane lies parallel to the chip top side of the chip(s).

The first and/or second mirror surface of the semiconductor laser amplifier(s) are/is preferably coated with one or more metallic or dielectric reflection layers, in particular metal layers.

The top side of the semiconductor laser amplifier is preferably coated with an antireflection layer or an antireflection layer assembly over the whole area or at least in the region of the optical beam interface or beam interfaces.

The underside of the semiconductor laser amplifier is preferably coated with an antireflection layer or an antireflection layer assembly over the whole area or at least in the region of the optical beam interface or beam interfaces.

The diffraction and refraction structure preferably lies in a plane parallel to the waveguiding material layer or the waveguiding material layers.

The diffraction and refraction structure is preferably two-dimensionally location-dependent, specifically in one dimension depending on the location along the longitudinal direction of the waveguide and in a dimension perpendicular thereto depending on the location perpendicular to the longitudinal direction of the waveguide.

It is considered to be advantageous if the optical diffraction and refraction structure comprises elevated rings formed in each case in one or more material layers of the chip situated above the optical grating coupler. The rings preferably have different sizes, wherein each ring respectively encloses all smaller rings in its ring interior.

The rings are preferably arranged in each case elliptically and non-concentrically with respect to one another.

The ellipse centers of the elliptic rings preferably lie on a path which—as viewed in plan view—lies above the integrated optical waveguide and extends parallel to the longitudinal axis thereof and one path end of which is formed by the ellipse center of the smallest ring and the other path end of which is formed by the ellipse center of the largest ring.

Moreover, it is advantageous if at least one of the mirror surfaces of the at least one semiconductor laser amplifier is separated from the associated waveguide (that is to say the one assigned to the mirror surface) of the semiconductor laser amplifier or at least the active amplifier section of the semiconductor laser amplifier by way of a trench provided in the semiconductor laser amplifier.

Figure 2:
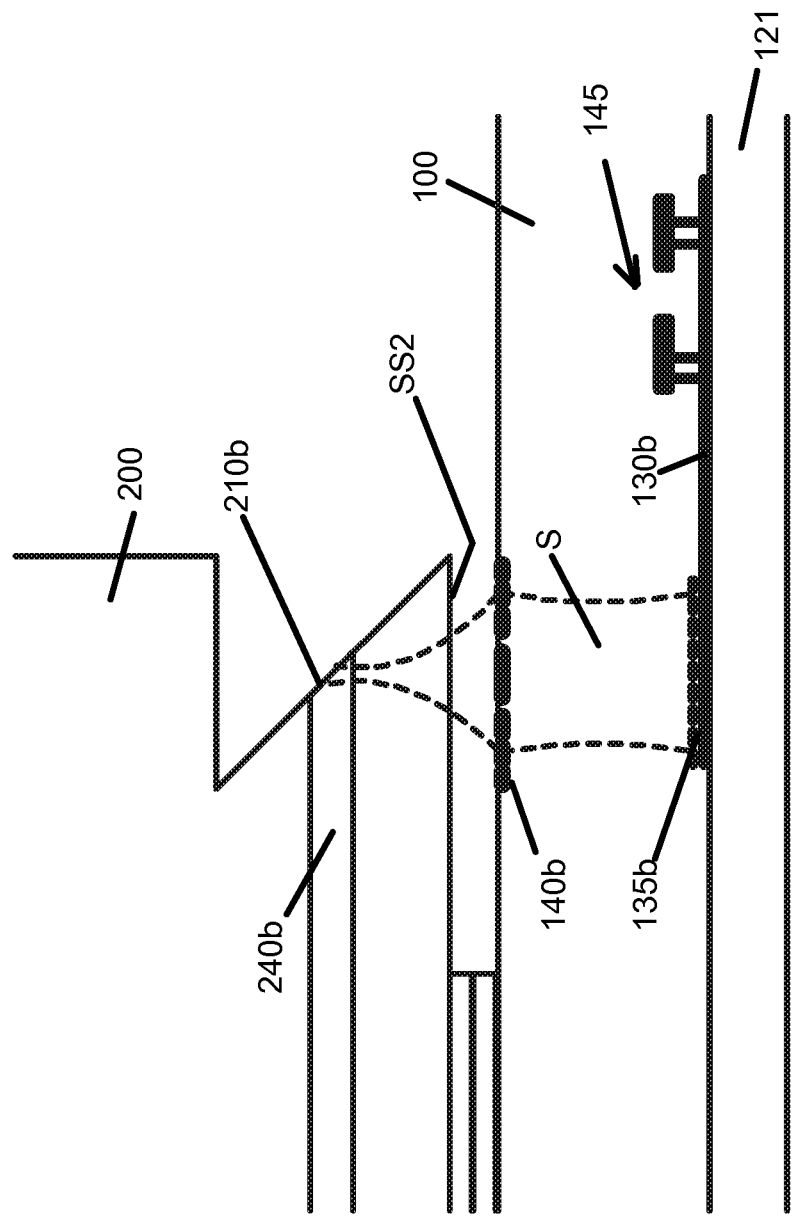
Figure 6:
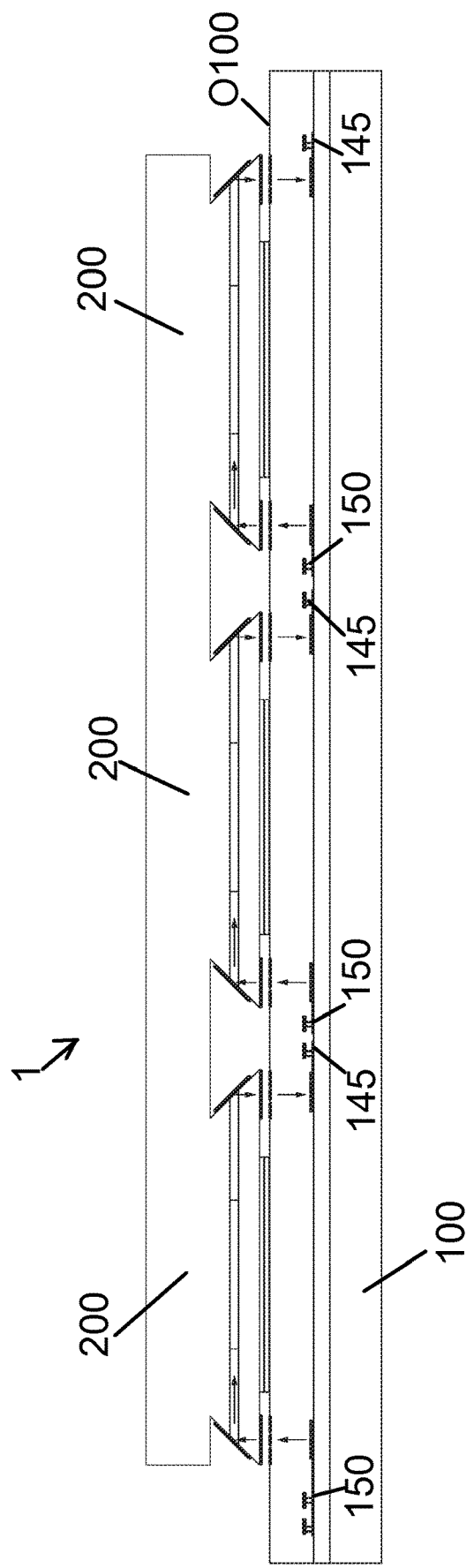
Figure 7:
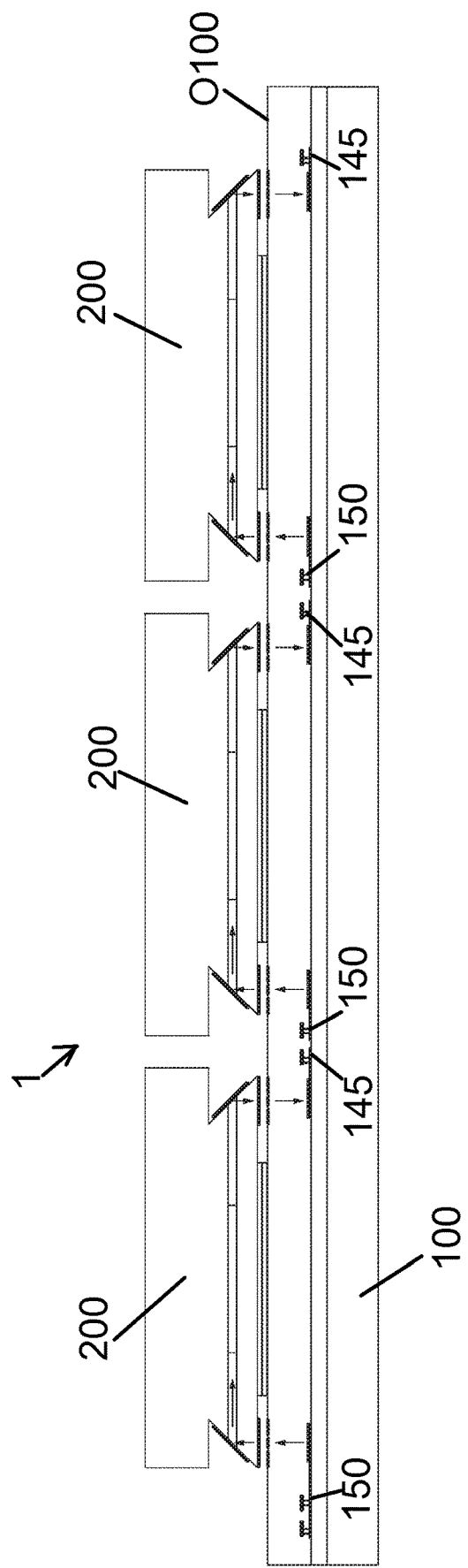
Figure 8:
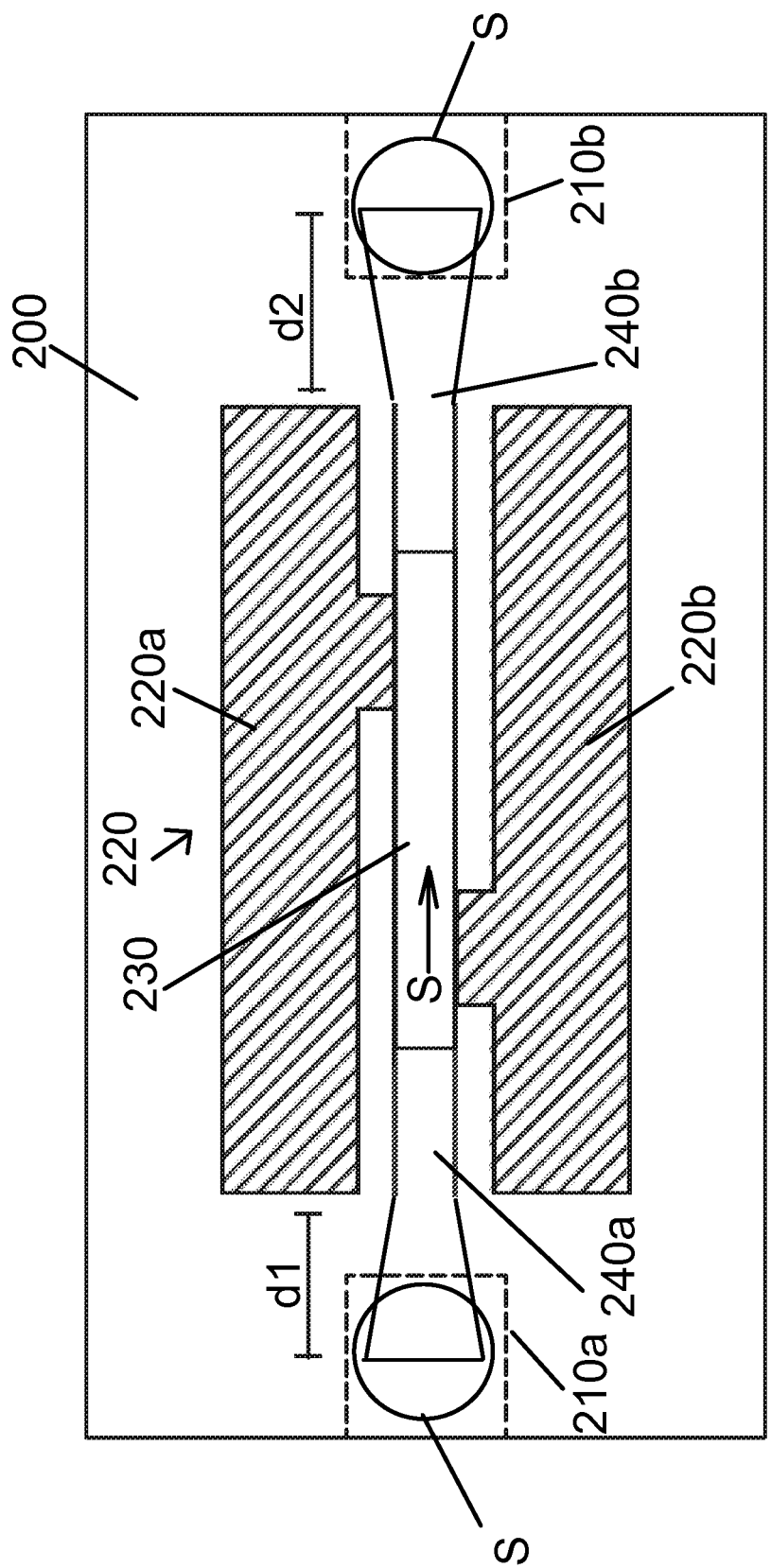
Figure 9:
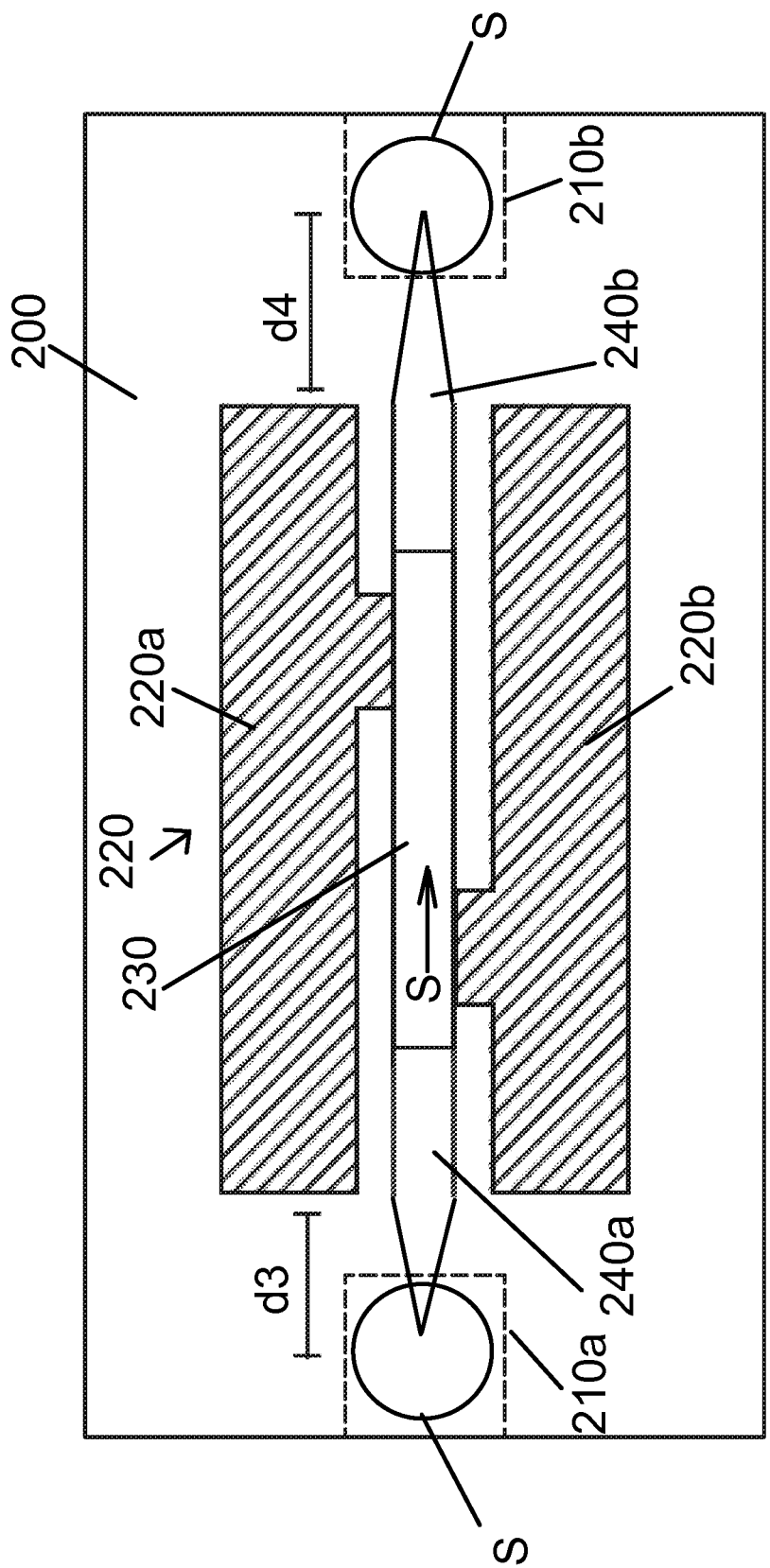
Figure 10:
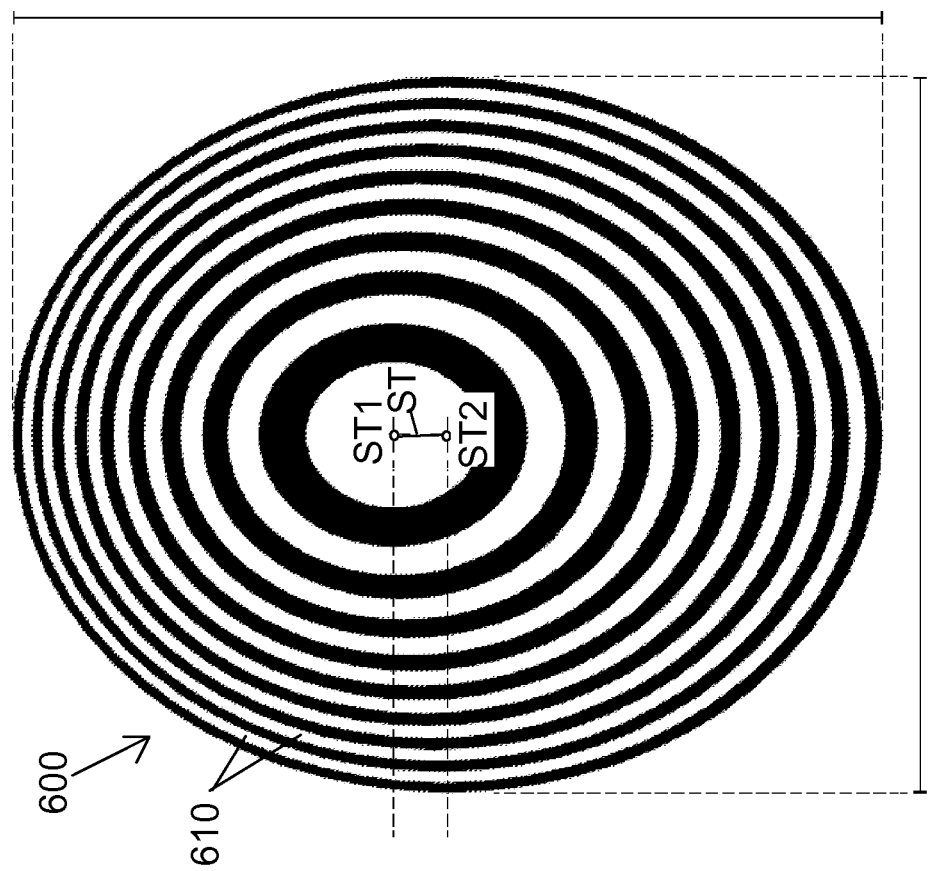

The invention is explained in greater detail below on the basis of exemplary embodiments; here by way of example FIG. 1 shows in a cross section a first exemplary embodiment of a photonic component according to the invention, FIG. 2 shows the deflection of optical radiation in the case of the component in accordance with FIG. 1 in more specific detail, FIGS. 3-7 show in cross section further exemplary embodiments of photonic components according to the invention, FIG. 8 shows in a plan view one exemplary embodiment of tapered strip waveguides in a semiconductor laser amplifier of a photonic component according to the invention, FIG. 9 shows in a plan view a further exemplary embodiment of tapered strip waveguides in a semiconductor laser amplifier of a photonic component according to the invention, FIG. 10 shows one exemplary embodiment of a lens which can be used in the components in accordance with FIGS. 1 to 9, FIG. 11 shows the structure of the lens in accordance with FIG. 10 in a cross section, and FIG. 12 shows in a cross section a section of a further exemplary embodiment of a photonic component according to the invention.

In the figures, the same reference signs are always used for identical or comparable component parts, for the sake of clarity.

FIG. 1 shows in a cross section one exemplary embodiment of a photonic component 1. The component 1 comprises a photonic integrated chip 100, on which a semiconductor laser amplifier 200 is placed.

The chip 100 comprises a substrate 110, which can be a silicon substrate, for example.

A layer assembly 120 comprising a multiplicity of material layers is arranged on the substrate 110. In the exemplary embodiment in accordance with FIG. 1, inter alia a first and second optical waveguide 130a and 130b, a first and second grating coupler 135a and 135b, a first and second diffraction and refraction structure in the form of two lenses 140a and 140b and a photodetector 145 are integrated in the layer assembly 120. The photodetector 145 is coupled to the end of the second optical waveguide 130b that is removed from the second grating coupler 135b.

The first or bottommost layer 121 of the layer assembly 120 situated on the substrate 110 is preferably a silicon oxide layer, on which a silicon layer 122 bears. Preferably the optical waveguides 130a and 130b and the grating couplers 135a and 135b are integrated in the silicon layer 122. The optical waveguides 130a and 130b can be for example so-called SOI rib or strip waveguides, wherein the optical radiation is guided in the silicon layer 122. The substrate 110 and the layers 121 and 122 are preferably formed by so-called SOI (silicon on insulator) material.

The photodetector 145 can be integrated in modified sections of the silicon layer 122 and/or in some other layer 123 which is situated on the silicon layer 122 and which can be for example a germanium or silicon-germanium layer.

The lenses 140a and 140b are integrated in the topmost material layer 124 or at least in one of the upper material layers of the layer assembly 120. The lenses 140a and 140b are thus situated—as viewed from the substrate 110—above the waveguiding layer 122 of the layer assembly 120 or above the layer in which the grating couplers 135a and 135b and the optical waveguides 130a and 130b are integrated. The arrangement of the lenses 140a and 140b makes it possible for the latter to carry out a beam shaping of the radiation before coupling into the underlying waveguide or after coupling out from the underlying waveguide.

The photonic integrated chip 100 furthermore comprises an optical transmission element 150, which can be a light emitting diode or a laser. The transmission element 150 is coupled to the end of the first optical waveguide 130a that is remote from the first grating coupler 135a. The transmission element 150 can be arranged as a separate component part, for example in the form of a separate transmission chip, above the optical waveguide 130a or directly on the latter or alternatively alongside the latter, for example in a manner directly adjoining the waveguide end in the case of an edge emitting transmission chip. By way of example, the transmission element 150, in a section in which the layer assembly 120 has a suitable opening can be inserted into this opening in order to reduce the distance from the waveguide 130a. Alternatively, it is also possible to provide one or more optically active layers in the layer assembly 120 if the transmission element 150 is intended to be integrated into the layer assembly 120 as part thereof.

FIG. 1 furthermore shows the configuration of the semiconductor laser amplifier 200 in more specific detail. The semiconductor laser amplifier 200 is preferably a monolithically integrated semiconductor component having a semiconductor layer construction on the basis of InP, GaAs, GaSb, or GaN material.

The semiconductor laser amplifier 200 comprises a first mirror surface 210a and a second mirror surface 210b. Between the two mirror surfaces 210a and 210b the semiconductor laser amplifier 200 comprises an amplifier section 220, which is formed by a layer section of an active material layer 230. The active material layer 230 can be embedded for example into a pn diode structure comprising a p-doped section 221 and an n-doped section 222.

The active material layer 230 is situated by itself or together with other layers, in particular those for forming the p-doped section 221 and the n-doped section 222, on a top side O205 of a substrate 205 of the semiconductor laser amplifier 200.

The first mirror surface 210a is connected to the amplifier section 220 via a first strip waveguide 240a, which is preferably formed in the active material layer 230, but alternatively can also be formed in a different layer of the semiconductor laser amplifier 200.

The second mirror surface 210b is connected to the amplifier section 220 via a second strip waveguide 240b, which is preferably likewise formed in the active material layer 230, but alternatively can also be formed in a different material layer of the semiconductor laser amplifier 200.

The orientation of the two mirror surfaces 210a and 210b is at an angle with respect to the surface normal to the top side O200 of the semiconductor laser amplifier 200 and also at an angle with respect to the surface normal to the chip top side O100 of the photonic integrated chip 100. The angle between each of the two mirror surfaces 210a and 210b and the surface normal to the top sides O200 and O100, respectively, is preferably 45°±10°.

In the region of the first and second beam interfaces SS1 and SS2, at which radiation is or can be respectively coupled into or out of the semiconductor laser amplifier 200, the top side O200 is preferably coated with an antireflection layer AR or an antireflection layer assembly.

With regard to optimum or low-loss mirroring of radiation at the two mirror surfaces 210a and 210b, it is considered to be advantageous for the latter to be provided with a metallic or dielectric reflection layer M.

The active material layer 230 of the semiconductor laser amplifier 200 lies parallel to the waveguiding layer of the chip 100, in which the optical waveguides 130a and 130b and the grating couplers 135a and 135b are integrated.

The photonic component 1 in accordance with FIG. 1 can be operated for example as follows:

optical radiation S is generated by the transmission element 150 and coupled into the first integrated optical waveguide 130a. The optical waveguide 130a guides the radiation to the first grating coupler 135a, which deflects said radiation in the direction of the first lens 140a. The lens 140a carries out a beam shaping and in this case guides the radiation in the direction of the beam interface SS1 of the semiconductor laser amplifier 200 and thus in the direction of the first mirror surface 210a. The first mirror surface 210a reflects the radiation in the direction of the amplifier section 220 and thereby couples the radiation into the first strip waveguide 240a. After passing through the amplifier section 220, the amplified radiation passes via the second strip waveguide 240b to the second mirror surface 210b, which reflects the radiation in the direction of the second beam interface SS2 and thus in the direction of the photonic integrated chip 100. The amplified radiation passes via the second beam interface SS2 to the second lens 140b, which carries out a beam shaping and in this case directs the radiation in the direction of the second grating coupler 135b. The second grating coupler 135b couples the amplified radiation into the second optical waveguide 130b, which guides the radiation to the photodetector 145.

To summarize, the semiconductor laser amplifier 200 arranged over the integrated chip 100 serves to carry out an amplification of the radiation in order that a radiation power arriving at the photodetector 145 is higher than would be the case if the radiation were guided directly from the transmission element 150 through the material layer 122 of the photonic integrated chip 100.

The radiation S is coupled in and out at the chip top side O100 and the top side O200 of the semiconductor laser amplifier 200. The two lenses 140a and 140b lie respectively above the assigned grating couplers 135a and 135b and thus between the grating couplers 135a and 135b and the two beam interfaces SS1 and SS2 at the top side O200 of the semiconductor laser amplifier 200.

In order to enable an electrical connection between the semiconductor laser amplifier 200 and the chip 100, the chip top side O100 of the chip 100 and the top side O200 of the semiconductor laser amplifier 200 are preferably provided with electrically conductive contact regions or contact pads K.

FIG. 2 shows the manner of operation of the second mirror surface 210b of the semiconductor laser amplifier 200 in the case of the component 1 in accordance with FIG. 1 in more specific detail. It can be discerned that the amplified radiation S of the amplifier section 220 that is transported by the second strip waveguide 240b is specularly reflected in the direction of the second beam interface SS2 and thus in the direction of the second lens 140b. The second lens 140b carries out a beam shaping in order that the second grating coupler 135b situated underneath can couple the largest possible proportion of the amplified radiation S into the second integrated optical waveguide 130b.

Figure 3:
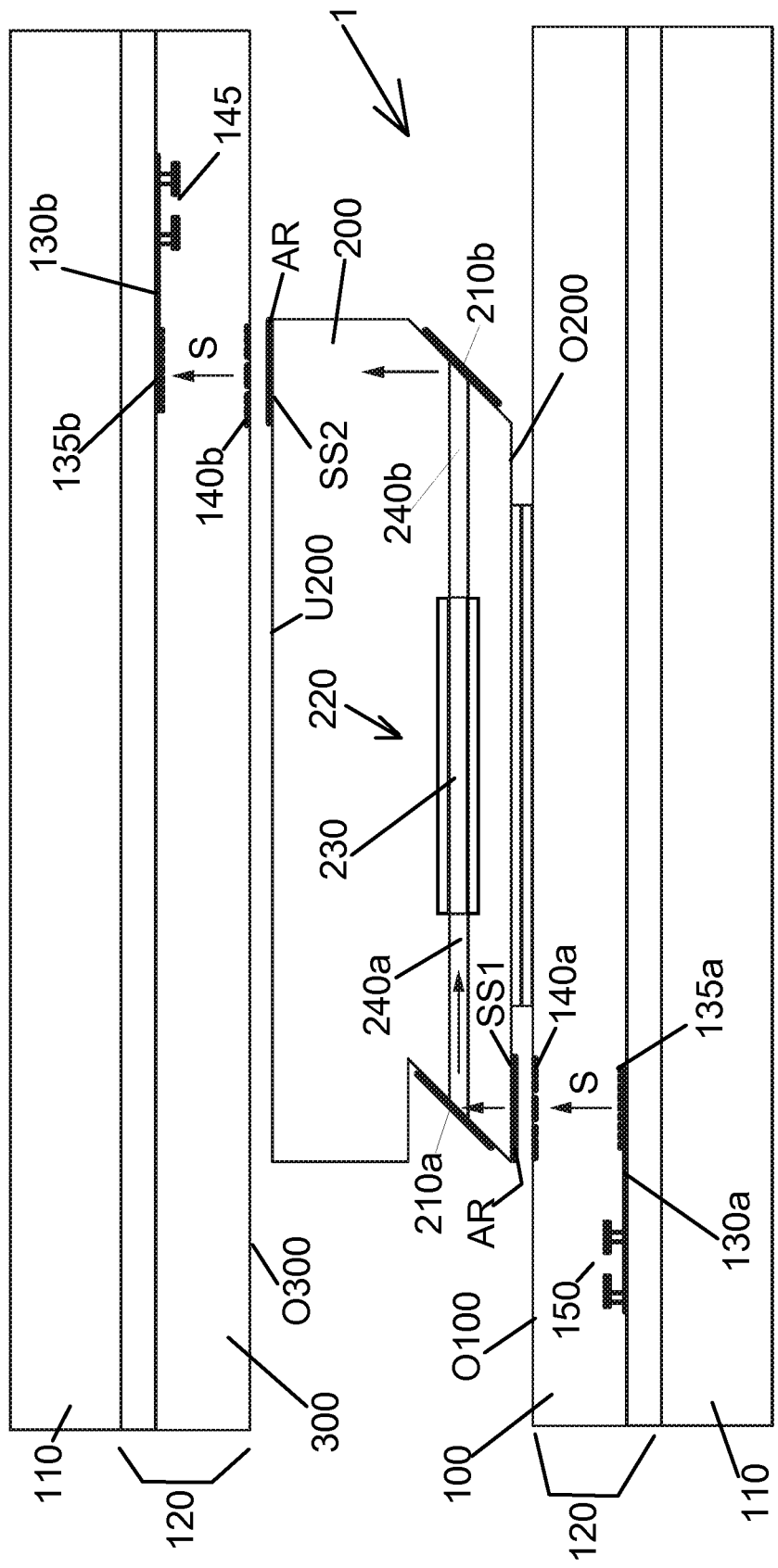

FIG. 3 shows a second example of a photonic component 1 comprising a semiconductor laser amplifier 200. Besides the semiconductor laser amplifier 200, the photonic component 1 comprises two photonic integrated chips, namely a first, lower chip 100 in FIG. 2 and a second chip 300 situated above the semiconductor laser amplifier 200.

The first chip 100 comprises a substrate 110 and a layer assembly 120, which correspond to the substrate 110 and the layer assembly 120 in the exemplary embodiment in accordance with FIG. 1; in this regard, reference should be made to the above explanations in association with FIG. 1.

An optical waveguide 130a, a grating coupler 135a and a lens 140a are integrated in the layer assembly 120. A transmission element 150 is connected to the optical waveguide 130a. The component parts mentioned may be identical to the corresponding component parts described in association with FIG. 1.

The second photonic chip 300 likewise comprises a substrate 110 and a layer assembly 120, which may be identical to the substrate 110 and to the layer assembly 120 of the chip 100 in accordance with FIG. 1; in this regard, reference should once again be made to the above explanations in association with FIG. 1.

A second integrated optical waveguide 130b, a second grating coupler 135b, a second lens 140b and a photodetector 145 are integrated in the layer assembly 120. With regard to the component parts 130b, 135b, 140b and 145, reference should be made to the above explanations in association with FIG. 1 since once again they can be the same component parts as in FIG. 1.

In the case of the exemplary embodiment in accordance with FIG. 3, the semiconductor laser amplifier 200 is configured differently than in the case of the exemplary embodiment in accordance with FIG. 1. In this regard, it can be discerned that the first mirror surface 210a and the second mirror surface 210b are parallel or at least approximately parallel and both are in each case at an angle of 45°±10° to the surface normal to the chip top side O100 of the first chip 100, to the surface normal to the chip top side O300 of the second chip 300, to the surface normal to the top side O200 of the semiconductor laser amplifier 200 and to the surface normal to the underside U200 of the semiconductor laser amplifier 200.

The remaining component parts of the semiconductor laser amplifier 200, that is to say the amplifier section 220, the active material layer 230 and the strip waveguides 240a and 240b may be structurally identical to those of the semiconductor laser amplifier 200 in accordance with FIG. 1, and so in this regard reference should be made to the above explanations in association with FIG. 1. In the region of the beam interfaces SS1 and SS2, the top side O200 and the underside U200 are preferably provided with an antireflection layer AR.

The active material layer 230 lies parallel to the waveguiding layer of the first chip 100, in which the optical waveguide 130a and the grating coupler 135a are integrated, and parallel to the waveguiding layer of the second chip 300, in which the second waveguide 130b and the second grating coupler 135b are integrated.

The described orientation of the mirror surfaces 210a and 210b in the case of the variant in accordance with FIG. 3 has the effect that the radiation S guided by the first chip 100 in the direction of the first mirror surface 210a subsequently no longer returns to the first chip 100, but instead is coupled to the second chip 300.

The semiconductor laser amplifier 200 in accordance with FIG. 3 can be operated for example as follows:

optical radiation S is generated by the transmission element 150 and coupled into the first optical waveguide 130a. The grating coupler 135a disposed downstream forwards the radiation to the first lens 140a, which carries out a beam shaping and directs the radiation in the direction of a first beam interface SS1 of the semiconductor laser amplifier 200 and to the first mirror surface 210a thereof. The first mirror surface 210a couples the radiation into the first strip waveguide 240a and thus into the amplifier section 220. The amplifier section 220 amplifies the radiation and guides the amplified radiation to the second mirror surface 210b, which directs said radiation to the underside U200 of the semiconductor laser amplifier 200. In the region of the underside U200, as a result of this deflection a beam interface SS2 is formed on the underside U200. The amplified radiation leaves the semiconductor laser amplifier 200 via the second beam interface SS2 and passes to the second lens 140b, which carries out a beam shaping and guides the amplified radiation to the second grating coupler 135b. The second grating coupler 135b couples the amplified radiation into the second integrated optical waveguide 130b, which guides the radiation to the photodetector 145.

In the case of the photonic component 1, the semiconductor laser amplifier 200 serves to amplify radiation S from the transmission element 150 before it passes to the photodetector 145. In this case, the arrangement operates two-dimensionally in such a way that waveguiding is effected either parallel to the active material layer 230 or perpendicular thereto, at least approximately perpendicular thereto.

Figure 4:
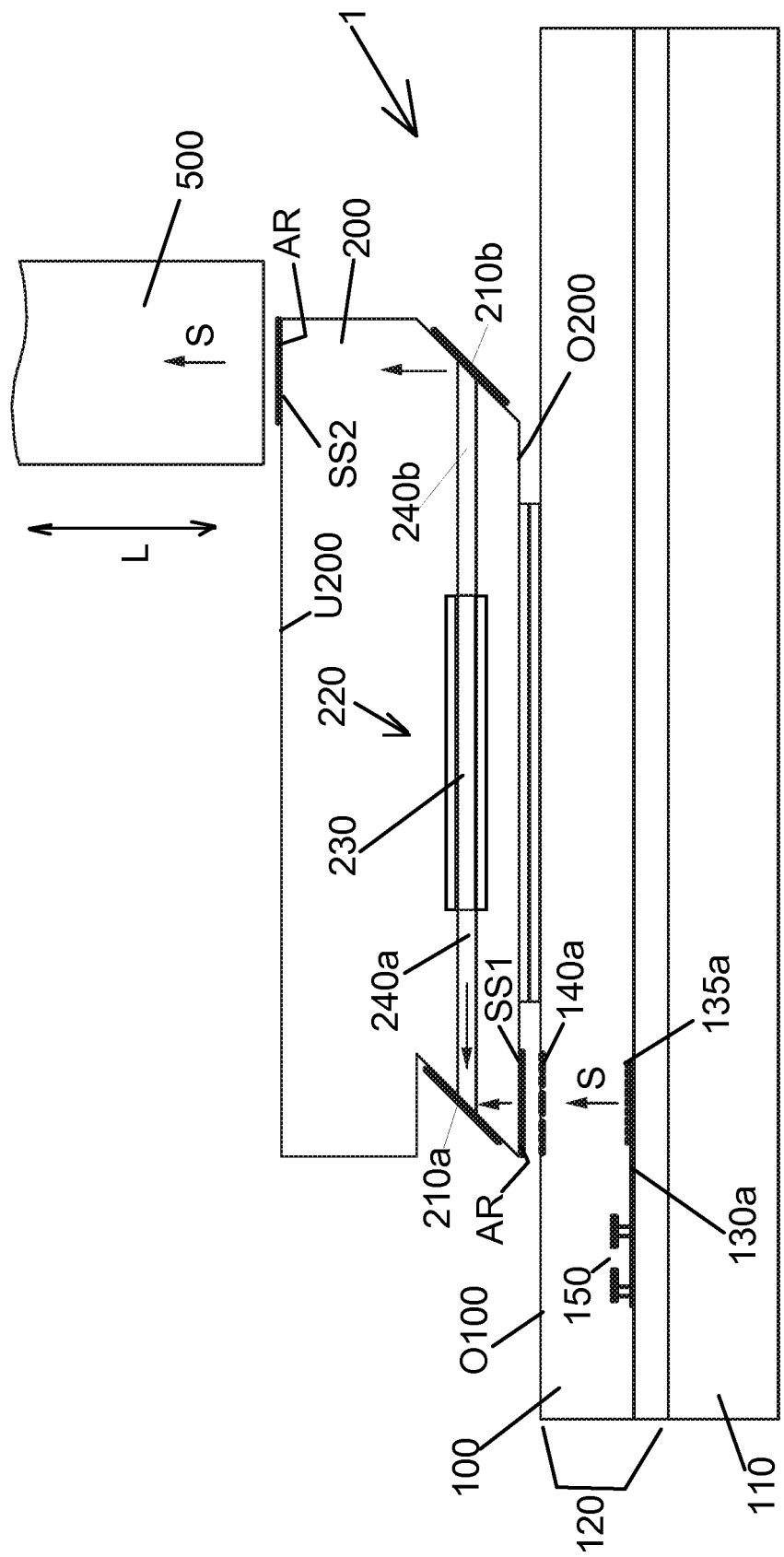

FIG. 4 shows one exemplary embodiment of a photonic component 1 which is identical to the embodiment variant in accordance with FIG. 3 with regard to the configuration of the first chip 100 and of the semiconductor laser amplifier 200. Instead of a second integrated chip 300, in the case of the embodiment variant in accordance with FIG. 4, a fiber 500 is provided, the fiber longitudinal direction L of which is oriented perpendicular to the surface normal to the underside U200 of the semiconductor laser amplifier 200.

The arrangement in accordance with FIG. 4 can be operated for example as follows:

radiation S is generated by the transmission element 150 and is fed into the amplifier section 220 via the first integrated optical waveguide 130a, the first grating coupler 135a, the first lens 140a and the first mirror surface 210a. In the amplifier section 220, the radiation is amplified and then deflected via the second mirror surface 210b to the second beam interface SS2. The amplified radiation passes into the fiber 500 via the second beam interface SS2.

Figure 5:
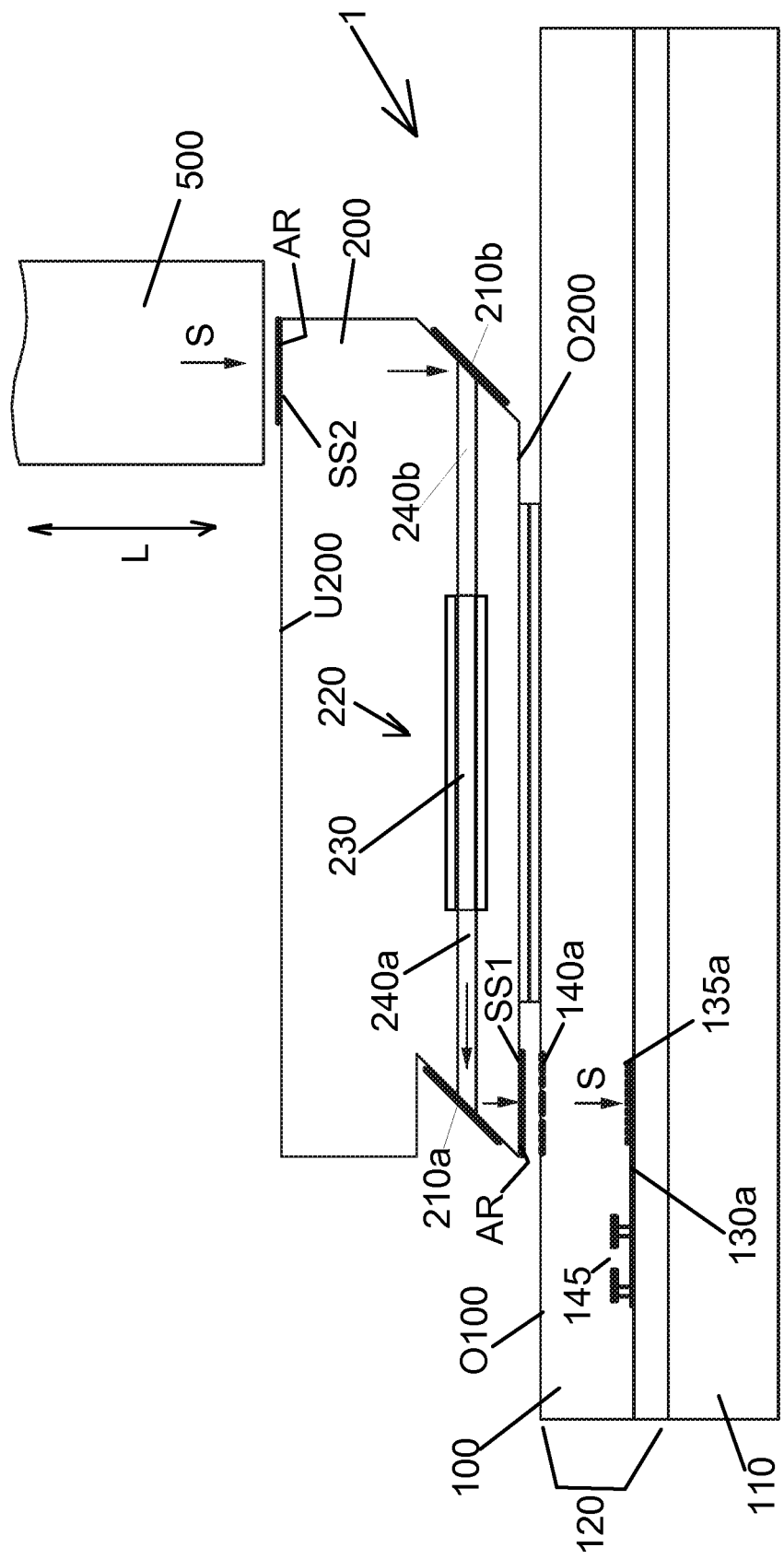

FIG. 5 shows an alternative configuration of the embodiment variant in accordance with FIG. 4. It can be discerned that a photodetector 145 is provided instead of the transmission element 150 in the first chip 100. In the case of such a configuration of the photonic component 1, it is possible to feed radiation S from the fiber 500 via the second mirror surface 210b into the amplifier section 220 and amplify it there. The amplified radiation then passes via the first mirror surface 210a to the photodetector 145, analogously to the embodiment variant in accordance with FIG. 1.

FIG. 6 shows an exemplary embodiment of a photonic component 1 in which a multiplicity of semiconductor laser amplifiers 200 are arranged on a first chip 100, which semiconductor laser amplifiers correspond or can correspond to the semiconductor laser amplifier 200 in accordance with FIG. 1 in terms of their construction.

In the chip 100 it is thus possible to integrate a multiplicity of transmission elements 150 and photodetectors 145, which are coupled to one another via the amplifier sections 220 of the semiconductor laser amplifiers 200.

The semiconductor laser amplifiers 200 can lie in the same plane and be arranged linearly one behind another, in particular one behind another along the longitudinal direction of the strip waveguides of the semiconductor laser amplifiers that are formed in the active material layer. Moreover, it is possible for two or more semiconductor laser amplifiers 200 to lie in the same plane and to be arranged linearly—perpendicular to the plane of the drawing in FIG. 6—one behind another, that is to say one behind another in an arrangement direction perpendicular to the longitudinal direction of the strip waveguides of the semiconductor laser amplifiers that are formed in the active material layer. Furthermore, it is possible for semiconductor laser amplifiers 200 to lie in the same plane, specifically in a two-dimensional arrangement, wherein the plane lies parallel to the chip top side O100 of the chip 100.

In the case of the embodiment variant in accordance with FIG. 6, the semiconductor laser amplifiers 200 share a common substrate.

FIG. 7 shows an embodiment variant for a photonic component 1 in which a multiplicity of semiconductor laser amplifiers 200 are placed on a photonic integrated chip 100, as is also the case in the exemplary embodiment in accordance with FIG. 6. In contrast to the exemplary embodiment in accordance with FIG. 6, the semiconductor laser amplifiers 200 in the embodiment in accordance with FIG. 7 are separated from one another and each have a dedicated substrate or accordingly in other words do not share a common substrate.

FIG. 8 shows one possible configuration for the two strip waveguides 240a and 240b of the semiconductor laser amplifier 200 in a plan view. It can be discerned that the two strip waveguides 240a and 240b can widen in the direction of the first and second mirror surfaces 210a and 210b, respectively, or can be tapered, in order that the spot diameter or the beam diameter of the radiation can be adapted on the path between the respective mirror surface and the amplifier section 220.

As a result of such widening, at the mirror surfaces 210a and 210b, respectively, it is possible to ensure an optimum beam size for the input or output coupling and achieve the effect that in the amplifier section 220 a maximum proportion of radiation is guided in the active material layer 230.

In the case of the embodiment variant shown in FIG. 8, the beam diameter for the radiation S passing from the mirror surface 210a to the amplifier section 220 will decrease in the path section d1 and widen again in the path section d2 on the way from the amplifier section 220 to the second mirror surface 210b.

Electrical connection sections for the amplifier section 220 are identified by the reference signs 220a and 220b in FIG. 8.

FIG. 9 shows another embodiment for the configuration of the strip waveguides 240a and 240b of the semiconductor laser amplifier 200. It can be discerned that the strip waveguides—as viewed from the amplifier section 220—taper in the direction of the mirror surfaces 210a and 210b, respectively, in path sections d3 and d4. As a result of such tapering, the beam diameter of the radiation S can likewise be adapted in order that at the mirror surfaces 210a and 210b, respectively, an optimum beam size for the input or output coupling is ensured and in the amplifier section 220 a maximum proportion of radiation is guided in the active material layer 230.

The path sections d3 and d4 are generally shorter or longer than the path sections d1 and d2 in FIG. 8. FIG. 10 shows an exemplary embodiment of a lens 600, which can be used as the first lens 140a or the second lens 140b in the case of the chips 100 and 300, in a plan view in more specific detail.

The lens 600 comprises elevated rings 610, which are preferably formed by steps in the material layer 124 of the layer assembly 120 (cf. e.g. FIG. 1). The rings 610 are of different sizes, wherein each ring respectively encloses all smaller rings in its ring interior. The lens 600 thus has a certain similarity to a Fresnel lens.

In contrast to a traditional Fresnel lens, the rings 610 are elliptic and not circular, nor are they arranged concentrically with respect to one another. In this regard, FIG. 10 reveals that the ellipse centers of the elliptic rings 610 lie on a path ST which—in the plan view in accordance with FIG. 10—lies parallel to the longitudinal axis of the first waveguide 130a and/or second waveguide 130b (cf. e.g. FIG. 1). One path end ST1 of the path ST is formed by the ellipse center of the smallest ring of the lens 600; the other path end ST2 of the path ST is formed by the ellipse center of the largest ring.

Figure 11:
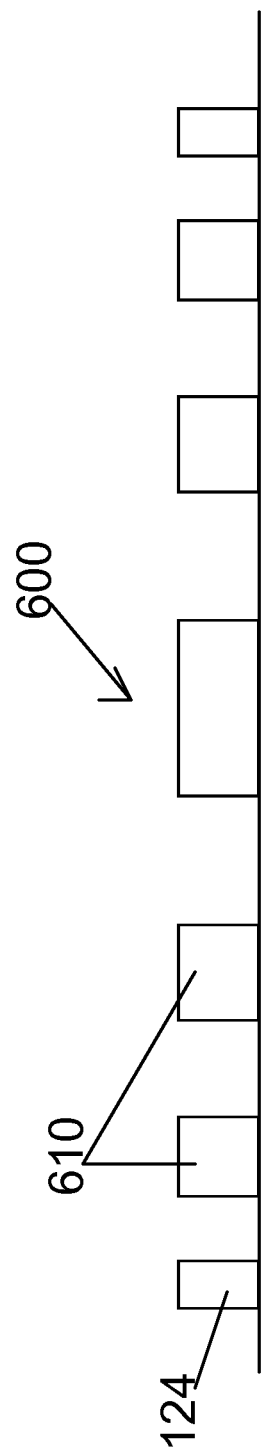

FIG. 11 shows in a cross section the formation of the rings 610 by steps in the material layer 124 of the layer assembly 120 (cf. e.g. FIG. 1) in more specific detail.

In the case of the embodiment variants in accordance with FIGS. 3 to 5, the first and second lenses 140a and 140b preferably differ with regard to their beam shaping behavior in order to take account of the circumstance of the different path distances between the plane of the active material layer 230 and the underside U200, on the one hand, and the plane of the active material layer 230 and the top side O200, on the other hand.

Moreover, provision can be made for at least one, preferably all, of the mirror surfaces of the semiconductor laser amplifier(s) to be separated from the associated waveguide of the semiconductor laser amplifier or the active amplifier section of the semiconductor laser amplifier via a trench provided in the semiconductor laser amplifier, said trench preferably forming an air gap.

FIG. 12 shows such an embodiment variant on the basis of the example of the second mirror surface 210b of the semiconductor laser amplifier 200, for example of the semiconductor laser amplifier 200 in accordance with FIG. 1. It can be discerned that the second mirror surface 210b is separated from the second strip waveguide 240b by a trench 700. A trench inner wall 701 of the trench 700 or a mirror layer situated thereon or a mirror layer assembly situated thereon forms the second mirror surface 210b.

The second mirror surface 210b can be formed by an outer surface—brought about by the trench 700—of the substrate 205 of the semiconductor laser amplifier 200 or an outer surface—brought about by the trench 700—of a layer or layer assembly situated on the substrate 205.

In the case of the variant in accordance with FIG. 12, the mirror surface 210b directly itself forms a beam interface of the semiconductor laser amplifier 200. For the rest, the above explanations in connection with FIGS. 1 to 11 are correspondingly applicable.

Although the invention has been more specifically illustrated and described in detail by means of preferred exemplary embodiments, nevertheless the invention is not restricted by the examples disclosed and other variations can be derived therefrom by the person skilled in the art, without departing from the scope of protection of the invention.

LIST OF REFERENCE SIGNS

1 Component
100 Chip
110 Substrate
120 Layer assembly
121 Material layer
122 Material layer/silicon layer
123 Material layer
124 Material layer
130a Waveguide
130b Waveguide
135a Grating coupler
135b Grating coupler
140a Lens
140b Lens
145 Photodetector
150 Transmission element
200 Semiconductor laser amplifier
205 Substrate
210a Mirror surface
210b Mirror surface
220 Amplifier section
220a Connection section
220b Connection section
221 p-doped section
222 n-doped section
230 Material layer
240a Strip waveguide
240b Strip waveguide
300 Chip
500 Fiber
600 Lens
610 Ring
700 Trench
701 Trench inner wall
AR Antireflection layer
d1 Path section
d2 Path section
d3 Path section
d4 Path section K Contact region/contact pad
L Fiber longitudinal direction
M Reflection layer
O100 Chip top side
O200 Top side
O205 Top side
O300 Chip top side
S Radiation
SS1 Beam interface
SS2 Beam interface
ST Path
ST1 Path end
ST2 Path end
U200 Underside

The invention claimed is:

1. A photonic component (1) having at least one semiconductor laser amplifier (200) comprising at least one first mirror surface (210a) for coupling in and/or coupling out optical radiation (S), characterized in that
the first mirror surface (210a) of the semiconductor laser amplifier (200) is coupled to a photonic integrated chip (100),
wherein the chip (100) is arranged in such a way that it can emit optical radiation (S) from its chip top side (O100) in the direction of the first mirror surface (210a) and couple it into the semiconductor laser amplifier (200) and/or can receive at its chip top side (O100) radiation (S) amplified by the semiconductor laser amplifier (200) and coming from the first mirror surface (210a) and couple it into itself,
wherein the radiation (S) is emitted away from the chip top side (O100) in the direction of the first mirror surface (210a) at an angle of about 90°±20°, in particular perpendicular, to the chip top side (O100) and/or the radiation (S) coming from the first mirror surface (210a) is coupled into the chip (100) at an angle of about 90°±20°, in particular perpendicular, to the chip top side (O100);
wherein the chip (100) further comprises:
a substrate (110),
at least one integrated optical waveguide (130a) which is integrated in one or more waveguiding material layers of the chip (100) situated on the substrate (110),
a first coupler, in particular grating coupler (135a), which is formed in the optical waveguide (130a) or is connected to the optical waveguide (130a), and
at least one optical diffraction and refraction structure which is arranged in a region of the chip top side (O100) and which is integrated in one or more material layers of the chip (100) situated—as viewed from the substrate (110)—above the first coupler and carries out a beam shaping of the radiation (S) before coupling into the waveguide (130a) or after coupling out of the waveguide (130a) and wherein the at least one optical diffraction and refraction structure is a Fresnel lens having elliptic rings which are not circular and not arranged concentrically with respect to one another;
the component (1) comprises at least one first and one second photonic integrated chip (100, 300) which enclose the semiconductor laser amplifier (200) between them, in particular to form a sandwich structure,
the first mirror surface (210a) of the semiconductor laser amplifier (200) is coupled to the first chip (100) and a second mirror surface (210b) of the semiconductor laser amplifier (200) is coupled to a second chip (300); and
the first chip (100) comprises
wherein the at least one optical diffraction and refraction structure is radiation-connected to the first mirror surface (210a) of the semiconductor laser amplifier (200) and carries out a beam shaping of the radiation (S) after coupling out of the first waveguide (130a) and before emission at the chip top side (O100), and
the second chip (300) comprises
a second integrated optical waveguide (130b),
a second coupler which is formed in the second optical waveguide (130b) or is connected to the second optical waveguide (130b),
a second optical diffraction and refraction structure which is arranged in a region of the second chip top side (O300) and which is integrated in one or more material layers of the chip (300) situated—as viewed from the substrate (110) of the second chip (300)—above the second coupler and is radiation-connected to the second mirror surface (210b) of the semiconductor laser amplifier (200) and carries out a beam shaping of the radiation (S) amplified by the semiconductor laser amplifier (200) before coupling into the second coupler.

2. The component (1) as claimed in claim 1, characterized in that the chip (100) is connected to the semiconductor laser amplifier (200) in such a way, in particular bears by its chip top side (O100) on the top side or underside (O200, U200) of the semiconductor laser amplifier (200) in such a way, that the optical diffraction and refraction structure lies in the beam path between the first coupler and the first mirror surface (210a) of the semiconductor laser amplifier (200).

3. The component (1) as claimed in claim 1, characterized in that
an active amplifier section (220) of the semiconductor laser amplifier (200) is situated in at least one active material layer (230) arranged on a top side of the semiconductor laser amplifier (200), and
the at least one active material layer (230) is arranged parallel to the material layer(s) of the chip (100) in which the at least one integrated optical waveguide (130a) of the chip (100) is integrated.

4. The component (1) as claimed in claim 1, wherein
the second optical diffraction and refraction structure is arranged in the region of the chip top side (O100) and is integrated in one or more material layers of the chip (100) situated—as viewed from the substrate (110)—above both the first and second couplers.

5. The component (1) as claimed in claim 4, characterized in that
the active material layer (230) is arranged parallel to the material layer(s) of the chip (100) in which both the first and second integrated optical waveguides (130a, 130b) of the chip (100) are integrated.

6. The component (1) as claimed in claim 1, characterized in that
one of the mirror surfaces (210a, 210b), that is to say the first or the second mirror surface (210a, 210b), forms an optical mirror connection between an optical beam interface (SS1) of the semiconductor laser amplifier (200), said optical beam interface being arranged at the top side (O200) of the semiconductor laser amplifier (200), and an active amplifier section (220) of the semiconductor laser amplifier (200), and
the other mirror surface (210a, 210b) forms a mirror connection between an optical beam interface (SS2) of the semiconductor laser amplifier (200), said optical beam interface being arranged at the underside (U200)

of the semiconductor laser amplifier (200), and the active amplifier section (220) of the semiconductor laser amplifier (200).

7. The component (1) as claimed in claim 6, characterized in that
the second mirror surface (210*b*) is coupled to an optical fiber (500), the fiber longitudinal direction (L) of which is arranged at an angle of 90°±10°, in particular perpendicular, to the top side and/or underside (O200, U200) of the semiconductor laser amplifier (200).

8. The component (1) as claimed in claim 1, characterized in that
the first mirror surface (210*a*) forms an optical mirror connection between an optical beam interface (SS1) arranged at the top side (O200) of the semiconductor laser amplifier (200) and an active amplifier section (220) of the semiconductor laser amplifier (200), and
the second mirror surface (210*b*) forms a mirror connection between an optical beam interface (SS2) arranged at the underside (U200) of the semiconductor laser amplifier (200) and the active amplifier section (220) of the semiconductor laser amplifier (200).

9. The component (1) as claimed in claim 8, characterized in that
an active amplifier section (220) of the semiconductor laser amplifier (200) is situated in at least one active material layer (230) arranged on a top side of the semiconductor laser amplifier (200), and
the active material layer (230) is arranged parallel to the material layer(s) of the first chip (100) in which the at least one integrated optical waveguide (130*a*) of the first chip (100) is integrated, and is arranged parallel to the material layer(s) of the second chip (300) in which at least one integrated optical waveguide (130*b*) of the second chip (300) is integrated.

10. The component (1) as claimed in claim 1, characterized in that the first and second diffraction and refraction structures are different.

11. The component (1) as claimed in claim 1, characterized in that
a layer section of at least one active material layer (230) arranged on a top side of the semiconductor laser amplifier (200) forms an amplifier section (220) of the semiconductor laser amplifier (200) that amplifies radiation (S) during the operation of the semiconductor laser amplifier (200),
a first strip waveguide (240*a*) optically connects the first mirror surface (210*a*) and the amplifier section (220), and
a second strip waveguide (240*b*) optically connects a second mirror surface (210*b*) and the amplifier section (220).

12. The component (1) as claimed in claim 11, characterized in that the first and second strip waveguides (240*a*, 240*b*) are formed by strips in the at least one active material layer (230) of the semiconductor laser amplifier (200).

13. The component (1) as claimed in claim 11, characterized in that
the width of the first strip waveguide (240*a*) widens in the region upstream of the first mirror surface (210*a*) and in the direction of the first mirror surface (210*a*), and/or
the width of the second strip waveguide (240*b*) widens in the region upstream of the second mirror surface (210*b*) and in the direction of the second mirror surface (210*b*).

14. The component (1) as claimed in claim 11, characterized in that
the width of the first strip waveguide (240*a*) decreases in the region upstream of the first mirror surface (210*a*) and in the direction of the first mirror surface (210*a*), and/or
the width of the second strip waveguide (240*b*) decreases in the region upstream of the second mirror surface (210*b*) and in the direction of the second mirror surface (210*b*).

15. The component (1) as claimed in claim 1, characterized in that
the first mirror surface (210*a*) is at an angle of between 30° and 60° to the direction of propagation of the radiation (S) in the active material layer (230) of the semiconductor laser amplifier (200), and/or
a second mirror surface (210*b*) is arranged parallel to the first mirror surface (210*a*) or is arranged in a manner mirrored with respect to the latter, specifically in a manner mirrored about the surface normal to the active material layer (230).

16. The component (1) as claimed in claim 1, characterized in that
two or more semiconductor laser amplifiers (200) lie in the same plane and are arranged linearly one behind another, in particular one behind another along the longitudinal direction of strip waveguides (240*a*, 240*b*) of the semiconductor laser amplifiers (200) that are formed in the active material layer (230), and/or
two or more semiconductor laser amplifiers (200) lie in the same plane and are arranged linearly one behind another, in particular one behind another in an arrangement direction perpendicular to the longitudinal direction of the strip waveguides (240*a*, 240*b*) of the semiconductor laser amplifiers (200) that are formed in the active material layer (230), and/or
two or more semiconductor laser amplifiers (200) lie in the same plane, specifically in a two-dimensional arrangement, wherein the plane lies parallel to the chip top side (O100) of the chip(s) (100, 300).

17. The component (1) as claimed in claim 1, characterized in that at least one of the first mirror surface and a second mirror surface (210*a*, 210*b*) of the semiconductor laser amplifier (200) is separated from an associated waveguide (240*a*, 240*b*) of the semiconductor laser amplifier or at least an active amplifier section of the semiconductor laser amplifier (200) by way of a trench (700) provided in the semiconductor laser amplifier (200).

18. A photonic component (1) having at least one semiconductor laser amplifier (200) comprising at least one first mirror surface (210*a*) for coupling in and/or coupling out optical radiation (S), characterized in that
the first mirror surface (210*a*) of the semiconductor laser amplifier (200) is coupled to a photonic integrated chip (100),
wherein the chip (100) is arranged in such a way that it can emit optical radiation (S) from its chip top side (O100) in the direction of the first mirror surface (210*a*) and couple it into the semiconductor laser amplifier (200) and/or can receive at its chip top side (O100) radiation (S) amplified by the semiconductor laser amplifier (200) and coming from the first mirror surface (210*a*) and couple it into itself,
wherein the radiation (S) is emitted away from the chip top side (O100) in the direction of the first mirror surface (210*a*) at an angle of about 90°±20°, in particular perpendicular, to the chip top side (O100) and/or the radiation (S) coming from the first mirror surface (210a) is coupled into the chip (100) at an angle of about 90°±20°, in particular perpendicular, to the chip top side (O100);

wherein the chip (100) further comprises:

a substrate (110), at least one integrated optical waveguide (130a) which is integrated in one or more waveguiding material layers of the chip (100) situated on the substrate (110), a first coupler, in particular grating coupler (135a), which is formed in the optical waveguide (130a) or is connected to the optical waveguide (130a), and at least one optical diffraction and refraction structure which is arranged in a region of the chip top side (O100) and which is integrated in one or more material layers of the chip (100) situated—as viewed from the substrate (110)—above the first coupler and carries out a beam shaping of the radiation (S) before coupling into the waveguide (130a) or after coupling out of the waveguide (130a) and wherein the at least one optical diffraction and refraction structure is a Fresnel lens having elliptic rings which are not circular and not arranged concentrically with respect to one another;

a layer section of at least one active material layer (230) arranged on a top side of the semiconductor laser amplifier (200) forms an amplifier section (220) of the semiconductor laser amplifier (200) that amplifies radiation (S) during the operation of the semiconductor laser amplifier (200), a first strip waveguide (240a) optically connects the first mirror surface (210a) and the amplifier section (220), a second strip waveguide (240b) optically connects a second mirror surface (210b) and the amplifier section (220)

the width of the first strip waveguide (240a) widens in the region upstream of the first mirror surface (210a) and in the direction of the first mirror surface (210a), and/or the width of the second strip waveguide (240b) widens in the region upstream of the second mirror surface (210b) and in the direction of the second mirror surface (210b).

19. A photonic component (1) having at least one semiconductor laser amplifier (200) comprising at least one first mirror surface (210a) for coupling in and/or coupling out optical radiation (S), characterized in that the first mirror surface (210a) of the semiconductor laser amplifier (200) is coupled to a photonic integrated chip (100), wherein the chip (100) is arranged in such a way that it can emit optical radiation (S) from its chip top side (O100) in the direction of the first mirror surface (210a) and couple it into the semiconductor laser amplifier (200) and/or can receive at its chip top side (O100) radiation (S) amplified by the semiconductor laser amplifier (200) and coming from the first mirror surface (210a) and couple it into itself, wherein the radiation (S) is emitted away from the chip top side (O100) in the direction of the first mirror surface (210a) at an angle of about 90°±20°, in particular perpendicular, to the chip top side (O100) and/or the radiation (S) coming from the first mirror surface (210a) is coupled into the chip (100) at an angle of about 90°±20°, in particular perpendicular, to the chip top side (O100);

wherein the chip (100) further comprises:

a substrate (110), at least one integrated optical waveguide (130a) which is integrated in one or more waveguiding material layers of the chip (100) situated on the substrate (110), a first coupler, in particular grating coupler (135a), which is formed in the optical waveguide (130a) or is connected to the optical waveguide (130a), and at least one optical diffraction and refraction structure which is arranged in a region of the chip top side (O100) and which is integrated in one or more material layers of the chip (100) situated—as viewed from the substrate (110)—above the first coupler and carries out a beam shaping of the radiation (S) before coupling into the waveguide (130a) or after coupling out of the waveguide (130a) and wherein the at least one optical diffraction and refraction structure is a Fresnel lens having elliptic rings which are not circular and not arranged concentrically with respect to one another;

a layer section of at least one active material layer (230) arranged on a top side of the semiconductor laser amplifier (200) forms an amplifier section (220) of the semiconductor laser amplifier (200) that amplifies radiation (S) during the operation of the semiconductor laser amplifier (200), a first strip waveguide (240a) optically connects the first mirror surface (210a) and the amplifier section (220), and a second strip waveguide (240b) optically connects a second mirror surface (210b) and the amplifier section (220)

the width of the first strip waveguide (240a) decreases in the region upstream of the first mirror surface (210a) and in the direction of the first mirror surface (210a), and/or the width of the second strip waveguide (240b) decreases in the region upstream of the second mirror surface (210b) and in the direction of the second mirror surface (210b).

* * * * *